(12) United States Patent
Rao et al.

(10) Patent No.: US 6,225,143 B1
(45) Date of Patent: May 1, 2001

(54) FLIP-CHIP INTEGRATED CIRCUIT ROUTING TO I/O DEVICES

(75) Inventors: Ramoji Karumuri Rao, Sunnyvale; Mike Liang, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/089,703

(22) Filed: Jun. 3, 1998

(51) Int. Cl.[7] .......................... H01L 21/44; H01L 21/48; H01L 21/50

(52) U.S. Cl. .......................... 438/106; 438/107; 438/108; 438/613

(58) Field of Search .................... 438/106, 107, 438/108, 611, 612, 613

(56) References Cited

U.S. PATENT DOCUMENTS

| | | |
|---|---|---|
| 5,341,049 | * 8/1994 | Shimizu et al. . |
| 5,686,764 | 11/1997 | Fulcher . |
| 5,817,540 | * 10/1998 | Wark . |
| 5,925,931 | * 7/1999 | Yamamoto . |

* cited by examiner

*Primary Examiner*—Kevin M. Picardat
*Assistant Examiner*—D. M. Collins
(74) *Attorney, Agent, or Firm*—Mitchell, Silberberg & Knupp LLP (57) ABSTRACT

Tile-based routing between a bump pad and an input/output (I/O) device for implementation on a flip-chip integrated circuit (IC) die. A trace is routed between the bump pad and a position corresponding to a first I/O slot, the first I/O slot being at least partially occupied by the I/O device. A position is obtained for a device pad for the I/O device. The trace is then extended into an area corresponding to the position obtained for the device pad. It is a feature of this aspect of the invention that the trace extension extends the trace into a pad area for a second I/O slot, the second I/O slot being at least partially occupied by the I/O device. The invention also concerns a flip-chip integrated circuit (IC) die that includes a bump pad, an input/output (I/O) device, and a device pad electrically connected to the I/O device and disposed vertically adjacent to a portion of the I/O device. Also provided is an electrically conductive trace, including a first portion between the bump pad and a first position, the first position corresponding to a portion of the I/O device and being horizontally offset from the device pad, and also including a second portion between the first position and a second position corresponding to the device pad.

14 Claims, 7 Drawing Sheets

FLIP-CHIP INTEGRATED CIRCUIT ROUTING TO I/O DEVICES

BACKGROUND OF THE INVENTION

1. Field of the Invention

The present invention concerns routing of electrical connections during the design of flip-chip integrated circuits (ICs), and particularly relates to routing of electrical connections from bump pads to input/output devices on an IC.

2. Description of the Related Art

Certain IC chips (or dies), called wire-bond ICs, are fabricated with metal bonding pads along their periphery. These peripheral pads serve as terminals for connecting the die to external signals, including control signals, power and ground. Typically, the wire-bond IC die is mounted within a plastic or ceramic package having multiple pins, and wire connections are made between the die's bonding pads and the package's pins. Finally, the package containing the IC die is mounted onto a printed circuit board in a manner so as to establish electrical connections between the pins of the IC and other components on the printed circuit board. In this manner, external signals can be provided to and from the IC die.

However, the foregoing fabrication method has its limitations. First, because only the periphery of the chip is used for external connection pads, the number of such pads for a given sized chip is limited. In particular, advances in technology which permit more and more gates to be placed within a given chip area have resulted in an increased demand for such pads, particularly power and ground pads. In certain cases, the design requires more pads than can be provided solely at the chip's periphery. Second, when all the pads are provided only at the chip's periphery, additional routing is required to bring the corresponding signals, particularly power and ground signals, to the interior logic of the chip. Third, in wire-bond chips the wire connections between the die and the package pins introduce additional resistance and inductance which sometimes can impair the chip's performance.

Figure 1:
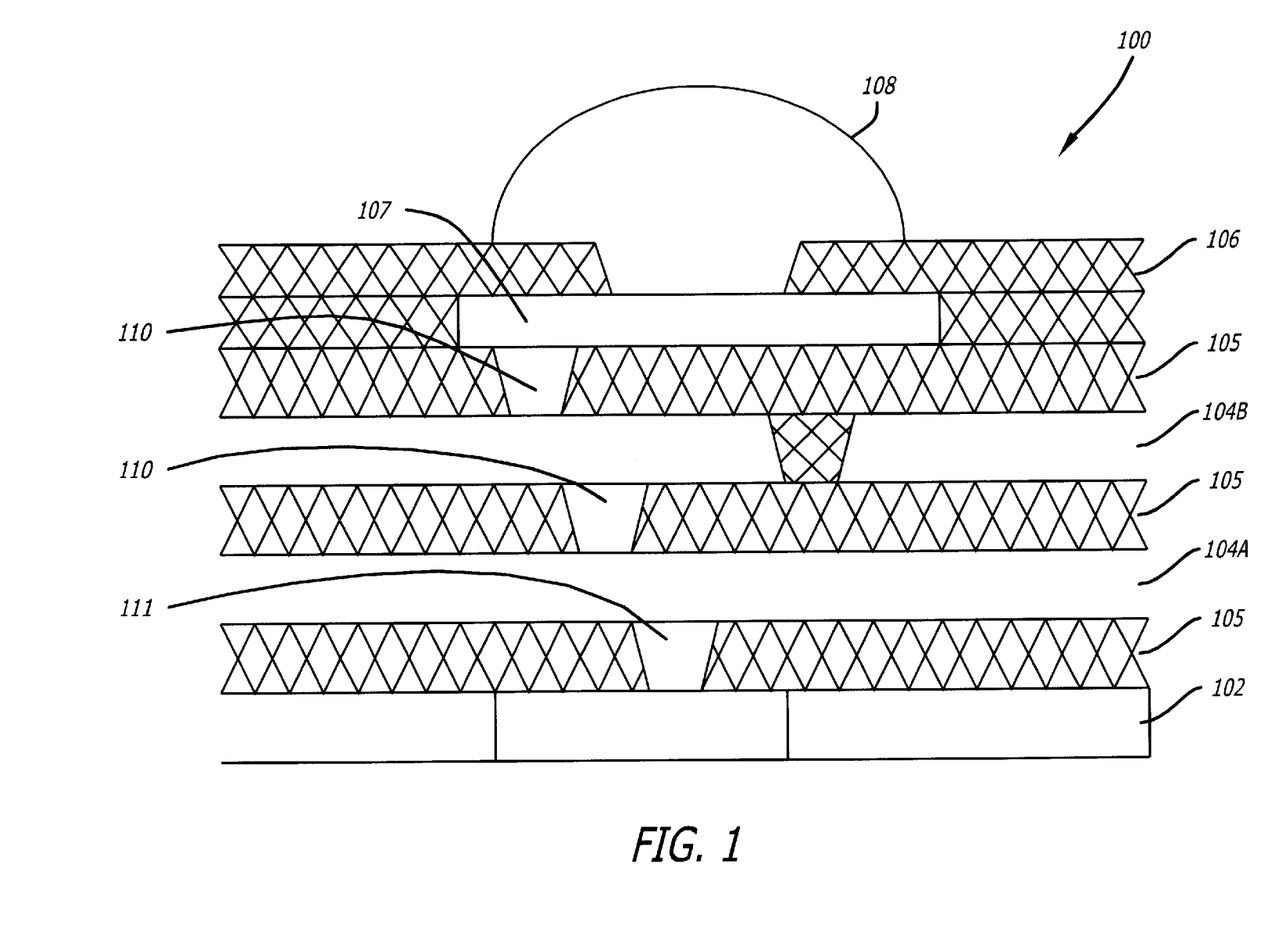
FIG. 1 is a cross-sectional view of a flip-chip integrated circuit.

To overcome these problems, flip-chip techniques recently have been used. One example of a flip-chip configuration is shown in FIG. 1, which provides a cross-sectional view of a flip-chip 100. Referring to FIG. 1, flip-chip 100 includes a semiconductor layer 102, on which are formed transistors, resistors and other electronic devices, as well as some of the electrical connections between such electronic devices. Flip-chip 100 also includes one or more metal layers, such as metal layers 104A and 104B, which are used for providing the bulk of the electrical connections between the electronic devices formed on semiconductor substrate 102. These metal layers generally are used primarily for the longer electrical connections, such as the connections between distant cells. By providing such metal layers, valuable space on the semiconductor layer 102 can be conserved for forming the electronic devices. Flip-chip 100 also includes a top layer 106, on which are formed multiple solder bump terminals, such as solder bump terminal 108, called bump pads. These bump pads are used as the input/output terminals for die 100. As used herein, input/output and I/O refer to input-only, output-only or combined input and input.

Referring to FIG. 1, bump pad 108 contacts redistribution metal layer 107. Redistribution metal layer 107, in turn, connects to metal layer 104B and metal layer 104B connects to metal layer 104A using vias 110. Finally, semiconductor layer 102 connects to metal layer 104A using contacts such as contact 111, thereby completing the electrical connections between bump pads 108 and semiconductor layer 102. Between layers 104B and 107 and between metal layer 104A and the semiconductor substrate 102 are electrically insulating layers 105.

For mounting purposes, flip-chip die 100 typically is "flipped" so that top layer 106 faces downward. Top layer 106 then is bonded to a substrate. The substrate may be a passive carrier such as a printed circuit board, or it may be another semiconductor chip. Specifically, each bump pad 108 typically is solder bonded to a corresponding pad on the substrate, thereby forming the required electrical connections. The substrate then is usually bonded directly to a printed circuit board, on which additional flip-chips and/or ICs utilizing other types of packaging are mounted.

Figure 2:
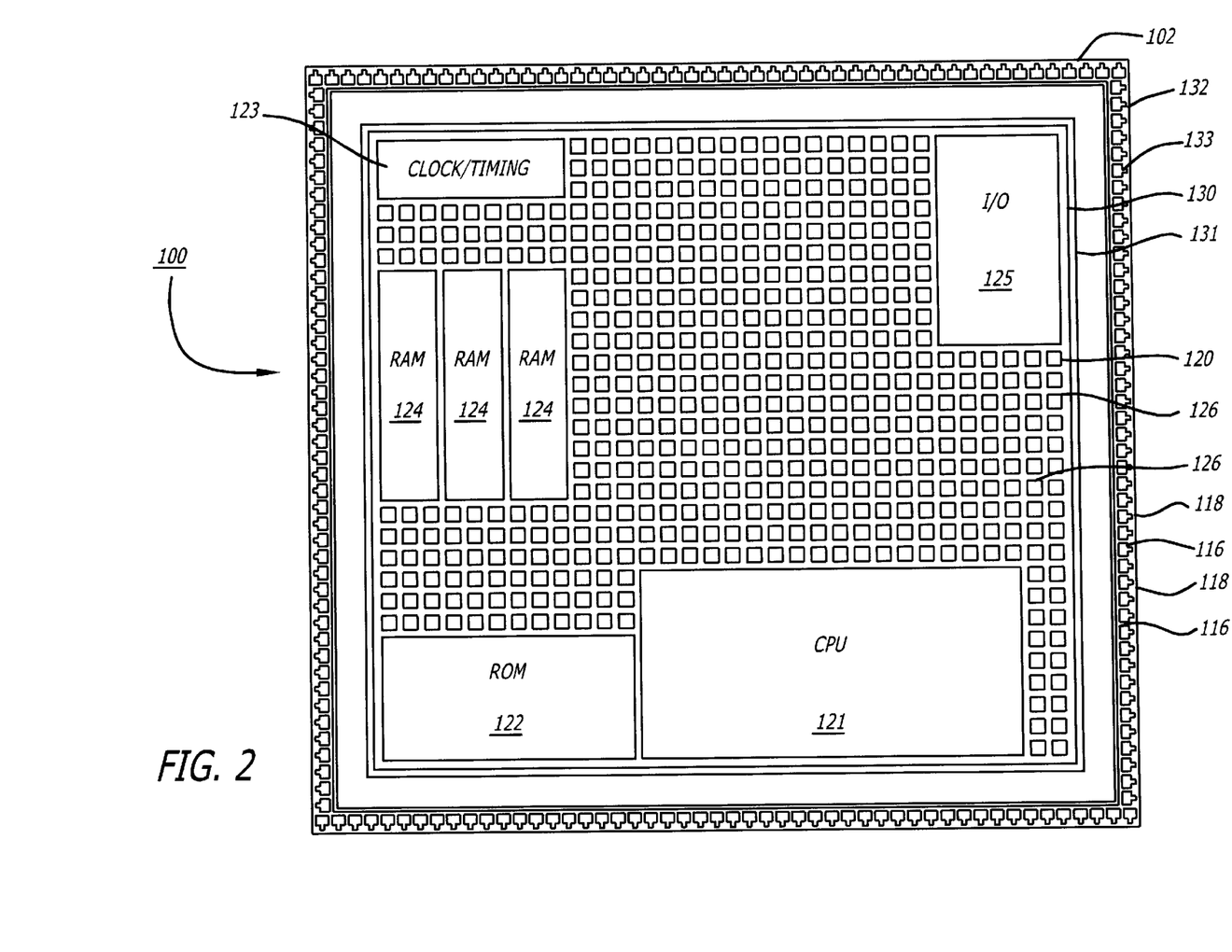
FIG. 2 is a representational view of the semiconductor substrate of a flip-chip integrated circuit.

FIG. 2 provides a representational illustration of semiconductor substrate 102. The logic circuitry of integrated circuit 100 is formed in the interior portion 120 of the semiconductor substrate 102, while the periphery of semiconductor substrate 102 is used for the I/O devices. The logic portion 120 includes a number of functional circuit blocks that can have different sizes and shapes. The larger blocks can include, for example, central processing units such as CPU 121, read-only memories such as ROM 122, clock/timing units such as clock/timing unit 123, random access memories such as RAMs 124, and I/O units such as I/O unit 125 for providing an interface between CPU 121 and various peripheral devices. These blocks, commonly known as macroblocks, can be considered as modules for use in various circuit designs, and are represented as standard designs in circuit libraries. The logic portion also includes tens of thousands, hundreds of thousands or even millions or additional small cells 126. Each cell 126 represents either a single logic element, such as a gate, or several logic elements interconnected in a standardized manner to perform a specific function. Cells that consist of two or more interconnected gates or logic elements are also available as standard modules in circuit libraries.

Along the periphery of semiconductor substrate 102 are various I/O devices or cells 116. Each such I/O device has connected to it at least one pad 118 which provides a means for electrically connecting to the respective I/O device 116. Pads 118 are, however, different from the bonding pads used in wire-bond IC devices. Rather than being used for wire bonding, pads 118 instead connect to metal traces on redistribution metal layer 107 by using a via. Accordingly, pads 118 generally can be significantly smaller than the wire bonding pads used in wire-bond integrated circuits.

I/O devices 116 receive power and ground by connecting to power (VDD) ring 132 and ground (VSS) ring 133. Similarly, internal logic circuitry 120 receives external power and ground by connecting to power (VDD2) ring 130 and ground (VSS2) ring 131. Typically, VDD2/VSS2 for the internal logic circuitry 120 is provided on a circuit which is separate from the VDD/VSS rings for I/O cells 116 in order to prevent the higher power, and thus noisier, I/O cells from corrupting the logic processing.

To further isolate the power/ground supplies for certain sensitive circuits from the power/ground supplies for noisier circuits, often times cuts are made in the rings (not shown). Each resulting ring segment is then supplied by separate external power/ground signals and can be used to supply a different type of circuit. In addition, although only a single I/O power ring 132 is shown in FIG. 2, mixed-voltage integrated circuits may utilize a different power ring for each different voltage. Moreover, rather than providing power/ ground rings 130 to 133 on substrate 102, these power/ground rings often are implemented on a metal layer which is used as a dedicated power plane.

Figure 3:
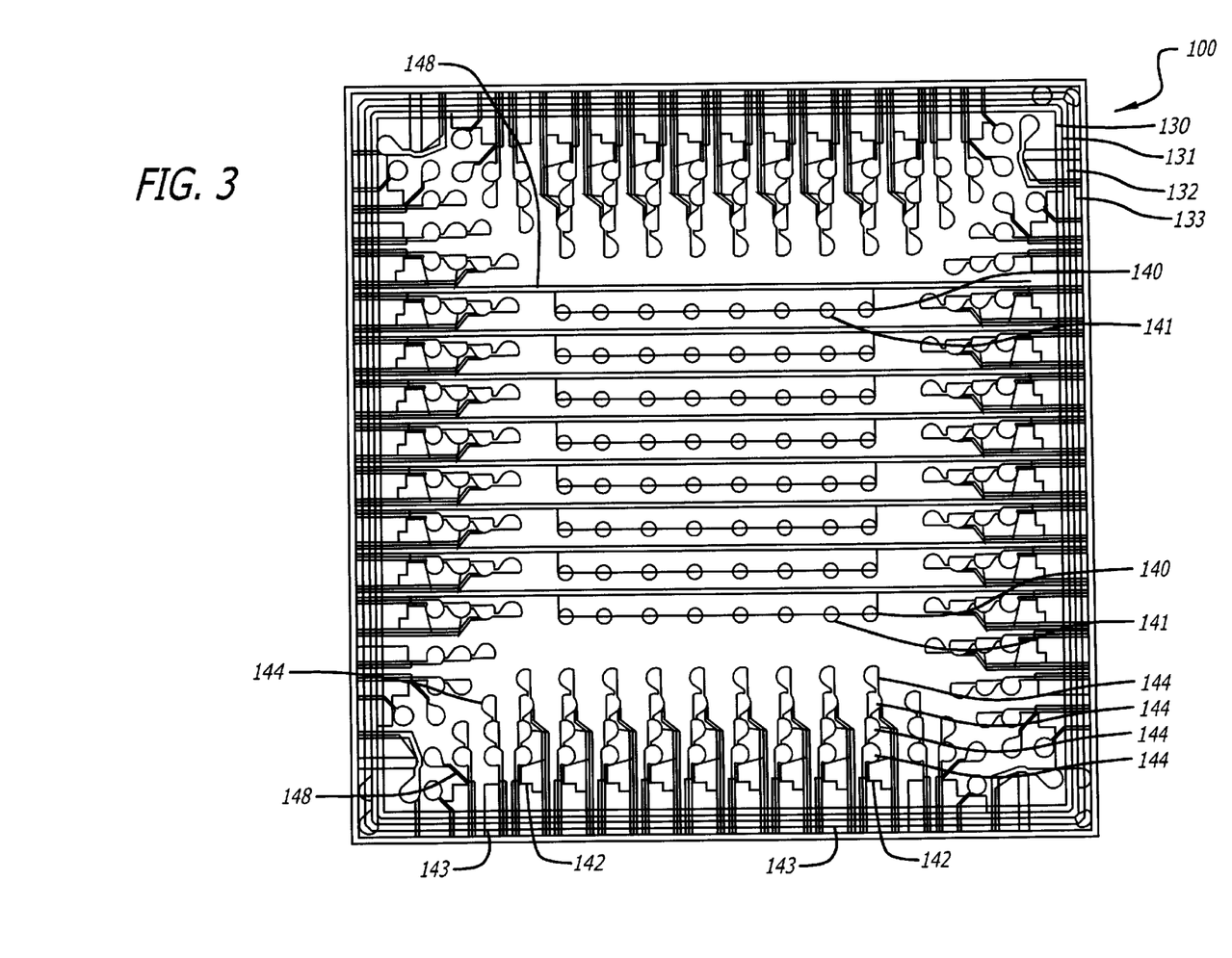
FIG. 3 is a representational view of the top metal layer of a flip-chip integrated circuit.

FIG. 3 is a representational view of the bump pad layout and trace connections of flip-chip die 100. As noted above, top layer 106 includes bump pads, such as bump pads 140 to 144. The redistribution layer 107 includes metal traces, such as traces 148, which electrically connect the bump pads to other areas on the die 100. For instance, each of bump pads 140 and 141 is connected using a trace 148 to VDD2 ring 130 and VSS2 ring 131, respectively, which supply the internal logic circuitry 120. Similarly, each of bump pads 142 and 143 is connected using a trace 148 to VDD ring 132 and VSS ring 133, respectively, which supply the I/O cells. Because the power/ground rings in fact are located on a different layer than redistribution metal layer 107 (e.g., metal layer 104A and/or 104B), each such trace in redistribution metal layer 107 does not actually directly connect to a power/ground ring, but instead terminates immediately above the respective power/ground ring. A via is then formed to connect that trace to the power/ground ring. Each of bump pads 144 connects to an I/O device. Bump pads 144 act as the die's terminals for external I/O signals such as clock, data, address and control signals. Therefore, the trace 148 from each of bump pads 144 terminates just above the corresponding I/O pad.

As shown above, in the flip-chip configuration bump pads can be distributed across the entire surface area of the chip. As a result of placing pads in the interior, as well as near the periphery, connections between the power/ground bump pads and the logic circuitry at the interior of the chip often can be shorter than corresponding connections in wire-bond ICs. Moreover, the flip-chip configuration generally permits the inclusion of more pads without utilizing additional space on the semiconductor layer. Finally, elimination of wire connections between the die and the package substrate often will reduce the inductance and resistance of such connections.

When using flip-chip techniques, a typical IC die often will contain hundreds of bump pads. Routing the signals from each of these bump pads to the appropriate position on the die can therefore become a complicated task. As a result, various methodologies have been developed to reduce this complexity. For instance, one common method utilizes tile-based, or grid-based, placement and routing. According to this method, a bump pad grid is selected based on bump pitch (i.e., required center-to-center bump spacing), and an I/O cell grid is selected based on a standard device width. Once these grids have been established, each bump pad and each I/O cell generally is required to be located within the respective grid slots. By thus constraining placement of bump pads and I/O cells to a finite number of discrete grid slots, the routing problem often can be simplified. For example, in one implementation a routing description between each bump pad slot and I/O slot pair is predetermined and stored in a library. Accordingly, the description of a trace between any specific bump pad and I/O device can be obtained from the library merely by providing indexes identifying the two grid slots.

Figure 4:
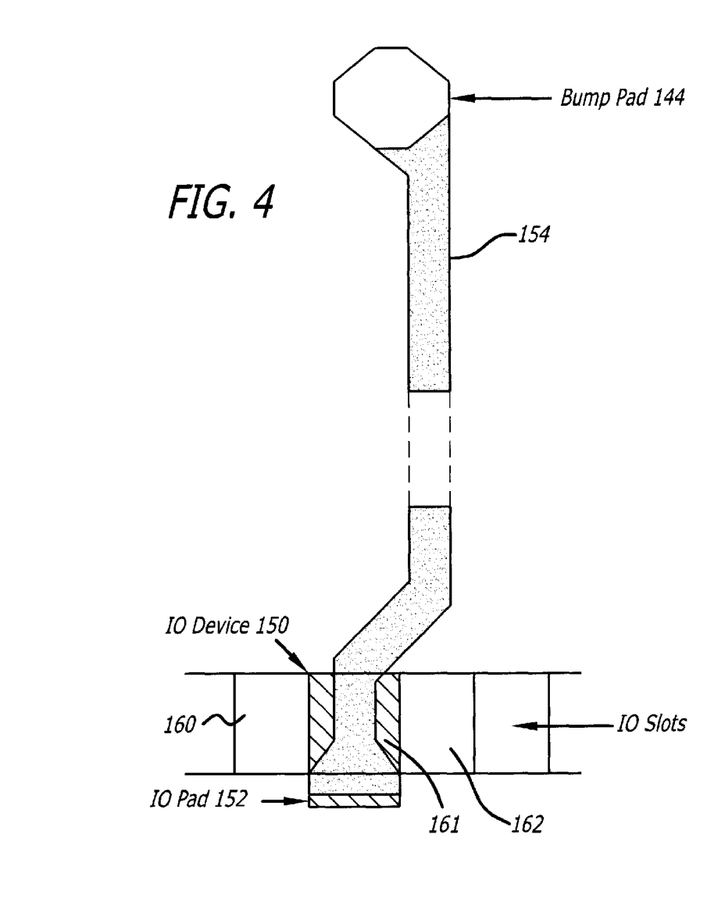
FIG. 4 illustrates a conventional trace routing from a flip-chip bump pad to an I/O device pad.

FIG. 4 illustrates an example of an electrical connection formed using tile-based routing between a bump pad 144 located in top layer 106 and an I/O device 150 located in semiconductor layer 102. As seen in FIG. 4, I/O device 150 is positioned in I/O slot 161 between I/O slots 160 and 162. Adjacent to I/O device 150 and electrically connected to I/O device 150 is device pad 152, which also is located on semiconductor layer 102. Metal trace 154 is provided on redistribution metal layer 107 and connects bump pad 144 to a point just above device pad 152. A via from redistribution metal layer 107 to semiconductor layer 102 at this point completes the electrical connection from bump pad 144 to device pad 152 for I/O device 150.

While the foregoing tile-based routing method works well for nearly equal-sized I/O devices, when the sizes of the I/O devices vary significantly, problems can arise due to the constraint that I/O devices must lie predefined grid slots. In particular, when a few of the I/O devices are wider than the standard width, it may become necessary to increase the grid slot pitch (i.e., the size of each grid slot) for the entire grid. However, doing so reduces the total number of grid slots, and therefore the number of cells, which can be placed on a given sized die. Often, this will result in a significant amount of wasted peripheral die space, particularly when the vast majority of the I/O devices are of standard width and therefore do not require the larger grid slot.

Similarly, simply maintaining grid slot pitch and using more than one grid slot for these wide I/O devices also can result in inefficient use of die space. For instance, consider the case in which a device pad for the I/O device is required to be located in a grid slot that is only partly occupied by the I/O device. In this event, routing the trace from the bump pad to the partly occupied grid slot generally will preclude use of the remainder of that grid slot for any portion of another I/O device. Moreover, accommodating cases where the device pad occupies portions of two different grid slots may not be possible by merely using conventional tile-based routing.

SUMMARY OF THE INVENTION

The present invention addresses these problems by routing an electrical trace to a position corresponding to a pad location for one grid slot and then extending the trace into a position corresponding to a pad location for a second grid slot.

According to one aspect, the invention concerns tile-based routing between a bump pad and an input/output (I/O) device for implementation on a flip-chip integrated circuit (IC) die. A trace is routed between the bump pad and a position corresponding to a first I/O slot, the first I/O slot being at least partially occupied by the I/O device. A position is obtained for a device pad for the I/O device. The trace is then extended into an area corresponding to the position obtained for the device pad. It is a feature of this aspect of the invention that the trace extension extends the trace into a pad area for a second I/O slot, the second I/O slot being at least partially occupied by the I/O device.

According to a further aspect, the invention performs tile-based routing between a bump pad located on a top layer and an input/output (I/O) device located on a lower layer of a flip-chip integrated circuit (IC) die. A trace is routed between the bump pad and a position directly above a first I/O slot which is at least partially occupied by the I/O device. A position is obtained for a device pad for the I/O device. The trace is then extended into a pad area for a second I/O slot and to an area directly above the position obtained for the device pad, the second I/O slot being at least partially occupied by the I/O device. A direct connection is then provided from the trace on the top layer of the IC die to the device pad on the lower layer.

By virtue of the foregoing arrangements, the present invention frequently can accommodate I/O devices that are wider than a single grid slot. At the same time, the invention often can be implemented by making only relatively minor changes to conventional tile-based routing, thereby also maintaining many of the benefits of conventional tile-based routing.

The present invention also addresses the problems of conventional routing by providing an integrated circuit having a trace which includes a first portion routed from a bump pad to a position horizontally offset from the I/O device pad and a second portion which extends the trace to a position corresponding to the device pad.

Thus, according to a further aspect, the invention is a flip-chip integrated circuit (IC) die that includes a bump pad, an input/output (I/O) device, and a device pad electrically connected to the I/O device and disposed vertically adjacent to a portion of the I/O device. Also provided is an electrically conductive trace, including a first portion between the bump pad and a first position, the first position corresponding to a portion of the I/O device and being horizontally offset from the device pad, and also including a second portion between the first position and a second position corresponding to the device pad.

According to a still further aspect, the invention is a flip-chip integrated circuit (IC) die that includes a bump pad, an input/output (I/O) device having pad space disposed vertically adjacent to a portion of the I/O device, and a device pad disposed within the pad space of the I/O device. Also provided is an electrically conductive trace, including a first portion between the bump pad and a first position corresponding to a portion of the pad space for the I/O device not occupied by said device pad, and also including a second portion between the first position and a second position corresponding to the device pad.

By virtue of the foregoing arrangements, the present invention can often accommodate wide I/O devices with minimal changes to the underlying routing scheme used in the chip design.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

The Design Cycle

Figure 5:
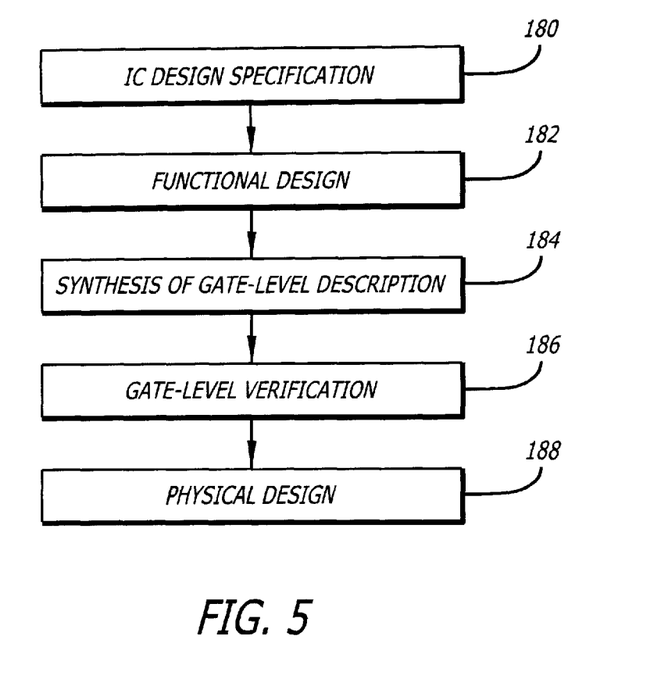
FIG. 5 is a flow diagram for explaining a flip-chip integrated circuit design cycle according to a representative embodiment of the invention.

FIG. 5 illustrates a flow diagram for providing a brief overview of flip-chip IC design according to a representative embodiment of the invention. Briefly, according to FIG. 5, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 180 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 182, a functional design is produced. Specifically, the functional design describes a system that will satisfy the IC design specification prepared in step 180. Preferably, the functional design is written using a highly structured syntax so as to permit subsequent steps in the design cycle to be performed using automated computer-aided design (CAD) tools. More preferably, the functional design is written in a hardware description language (HDL) such as VHDL (IEEE standard 1076–1993) or Verilog-HDL.

In step 184, a description of a gate-level circuit is synthesized based on the HDL code produced in step 182. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 184 is a "netlist", which categorizes a number of "nets", each including one or more gates and/or flip-flops, and which also describes the interconnections between these nets.

In gate-level verification step 186, a computer simulation is run to test the circuit design synthesized during gate-level design step 184. The goals of this simulation are to determine whether all performance criteria have been met and whether any timing or other circuit errors will occur in response to a variety of different input signals and conditions. Upon completion of gate-level verification is step 186, the netlist is provided to physical design step 188. In addition, a dump of top-level signals contained in the netlist is provided to the user for the user to designate the positions in which I/O devices corresponding to these signals will be implemented on the chip and to designate which bump pads will be connected to these I/O devices, as described in more detail below.

In physical design step 188, the netlist generated in step 186 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 188 is to implement the design using minimum chip area. Other factors considered during physical design include thermal generation, electromagnetic effects and the number of metal layers available for wire routing.

Step 188 produces a set of design files in an unambiguous representation known as an intermediate form that describes the layout. The design files are then converted into pattern generator files that are used to produce patterns called masks by an optical or electron beam pattern generator. The preferred implementation of physical design step 188 is discussed below in more detail in connection with FIG. 6.

It should be noted that while the foregoing design cycle is preferred, variations of the foregoing may also be used, as will be apparent to those skilled in the art. In addition, although the foregoing design process is described above and shown in FIG. 5 as being purely sequential, many times one or more of the steps will need to be repeated. That is, if the design is found to be unfeasible at one step, an earlier step might need to be re-executed to correct the problem. For example, it might occur that in step 184 a gate-level description can not be generated to satisfy the functional design requirements using the available technology library, while at the same time maintaining the user's design constraints. In this case, the functional description may need to be redesigned in step 182 in order to achieve a feasible design.

Physical Design

Figure 6:
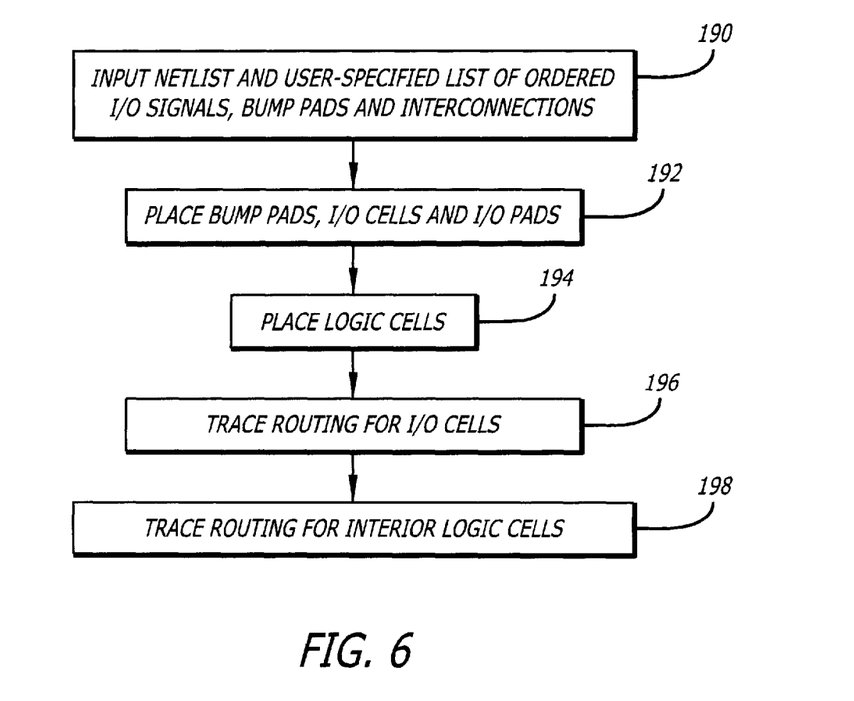
FIG. 6 is a flow diagram for describing the physical design phase of the flip-chip integrated circuit design cycle according to a representative embodiment of the invention.

A more detailed discussion of physical design step 188 (shown in FIG. 5) in the preferred embodiment of the invention will now be discussed with reference to the flow diagram shown in FIG. 6. Briefly, according to FIG. 6, (i) the netlist and a list of ordered I/O signals, bump pads and interconnections are input (ii) bump pads, I/O cells and I/O pads are placed; (iii) interior logic cells are placed; (iv) traces are routed between the bump pads, on the one hand, and power rings, ground rings and I/O device pads, on the other; and (v) traces are routed (both in the semiconductor layer and in the metal layers) between the interior logic cells and from interior logic the cells to the power and ground rings based on the connections specified in the netlist. Preferably, much of this work is performed using computer-aided design (CAD) tools.

In more detail, in step 190 the netlist is input from gate-level description synthesis step 184. As noted above, a dump of top-level signals contained in the netlist also has been provided to the user. In the preferred embodiment, the user specifies the positions for I/O devices corresponding to those signals, and in particular, specifies the order in which those I/O devices are to be placed around the periphery of the die. Preferably, the user also specifies bump pads to be used, as well as to which I/O device each bump pad is to be connected. For power/ground bump pads, the user also specifies to which power/ground ring the bump pad is to be connected. For ease of routing, it is preferable that the user place bump pads for internal logic power and ground at the interior of the die and bump pads for I/O power and ground near the periphery. The ordered list of signals (I/O devices) and the description of bump pads and interconnections created by the user also are input in this step.

In step 192, bump pad (x,y) coordinates are assigned based on both a predefined bump pad grid and the input user-specified bump pad grid positions. Each I/O device (or cell) also is placed, together with its pads, around the periphery of the die. In the preferred embodiment, this step is performed using an automated placement tool.

Placement of I/O cells and pads involves first obtaining from a library information defining a cell for each I/O signal in the user-supplied ordered list. The cell information includes the physical dimensions of the cell and information regarding the number, sizes and relative positions of any pads required for the corresponding I/O cell. Preferably, the device pad is located within a pad space which is vertically adjacent to the I/O device, with the center of the pad being coincident with the physical location within the I/O device of the I/O terminal. In the preferred embodiment, each I/O cell and each pad is rectangular in shape, and therefore the dimensions and relative positions of the I/O cell and pad are specified in the library as a lower-left and an upper-right corner for each, expressed in a relative coordinate system. Upon placement, these relative coordinates are mapped to absolute (x,y) coordinates, referenced from the lower-left corner of the chip edge on which the I/O device is located.

Preferably, the I/O cells are placed on the die's substrate in accordance with a predefined I/O cell grid and the ordered list of I/O signals input in step 190. In the preferred embodiment, an I/O cell is placed in a separate single grid slot if its width is less than or equal to the grid slot pitch; otherwise, different portions of the cell lie in different grid slots. Examples of cell placement are illustrated in FIGS. 7A and 7B.

Figure 7A:
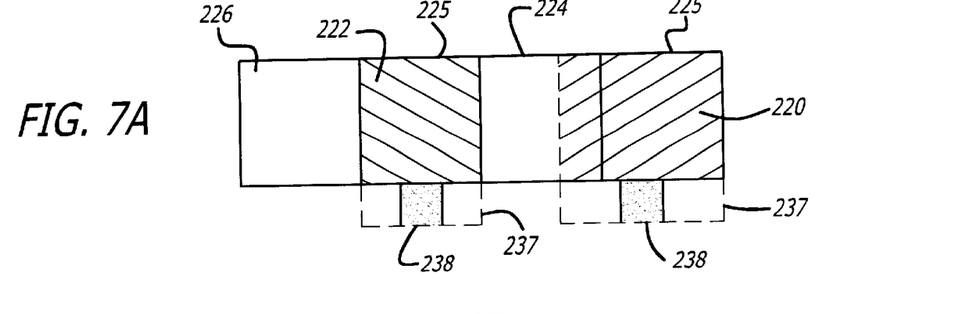
FIGS. 7A and 7B illustrate placement of I/O cells and I/O pads according to a representative embodiment of the invention.

In FIG. 7A, I/O cell 220 begins in grid slot 223 and extends into grid slot 224. The width of the next cell 222 is not greater than the grid slot pitch. Therefore, cell 222 is placed entirely within the next unoccupied grid slot 225, with grid slot 226 shown in FIG. 7A as being empty. However, referring to FIG. 7B, I/O cell 230 occupies all of grid slot 234 and a portion of grid slot 235, and next I/O cell 232 has a width which is greater than the grid slot pitch. Therefore, cell 232 is placed so that part of cell 232 lies in the unoccupied portion of grid slot 234 and the remainder of cell 232 lies in grid slot 235. Grid slot 236 is shown in FIG. 7B as being empty. While the foregoing describes one placement technique, the precise placement technique used is not critical. However, it is preferable that the placement tool: (i) permit portions of different I/O cells, particularly wide I/O cells, to share a single grid slot, thereby increasing placement efficiency; and (ii) dedicate at least one whole grid slot for the exclusive use of each I/O cell.

Figure 7B:
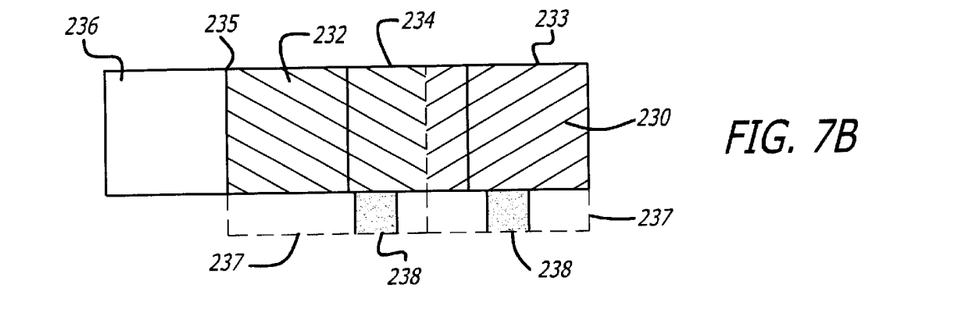

Each of I/O cells 220, 224, 230 and 234 shown in FIGS. 7A and 7B has associated with it one device pad 238 located in the I/O device's vertically adjacent pad space 237. As noted above, the exact position of each pad 238 within pad space 237 is stored in a library based on the position of the I/O terminal within the respective I/O device.

Returning to FIG. 6, in step 194 the logic cells are placed at the interior of the die. A main concern in performing this placement is to reduce spacing between cells, thereby minimizing the amount of wire routing that will need to be performed. The main sub-steps in performing step 194 are partitioning, floorplanning and layout.

A chip may contain several million transistors. Layout of the entire circuit generally cannot be handled due to the limitation of memory space as well as the computation power available. Therefore, the circuit is partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is preferably hierarchical, although nonhierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

In step 196, bump pad traces are routed to the I/O cells and the I/O cell power/ground rings. As for trace routing between bump pads and I/O cell power/ground rings, locations for the bump pads and I/O devices have already been established, and the user has specified at which I/O device the bump pad will connect to the applicable ring. Accordingly, the trace description can be obtained from a library of pre-stored trace descriptions by indexing into the library using the two grid slot locations. The steps for performing trace routing between bump pads and I/O device pads are discussed below with reference to FIG. 8.

In step 198, traces are routed from the interior logic cells to other logic cells, to the interior logic power and ground rings, and to the I/O cells. The objective of logic routing is to complete the interconnections between blocks according to the specified netlist. First, the space not occupied by blocks, which is called the routing space, is partitioned into rectangular regions called channels and switch boxes. The goal of the router is to complete all circuit connections using the shortest possible wire length and using only the channel and switch boxes.

Routing in this step is preferably done in two phases, referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Trace Routing Between Bump Pads and I/O Cell Pads

Figure 8:
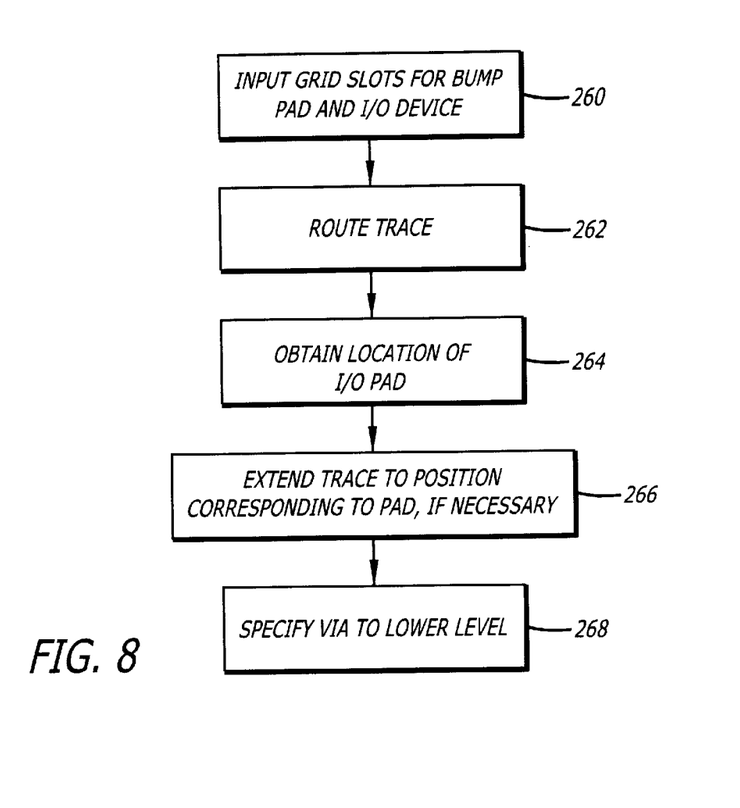
FIG. 8 is a flow diagram for explaining routing of traces between bump pads and I/O device pads according to a representative embodiment of the invention.

FIG. 8 illustrates a flow diagram for explaining the trace routing between bump pads and I/O device pads of step 196 (shown in FIG. 6), according to the preferred embodiment of the invention. Briefly, according to FIG. 8, grid slot locations for the bump pad and the I/O device are obtained, a trace is routed between the bump pad and the I/O device, the position of the device pad is obtained for the I/O device, the trace is extended to the device pad, and a via is specified.

In more detail, in step 260 grid slot locations for the bump pad and the I/O device are obtained. As noted above, the bump pad is located within exactly one of the bump pad grid slots. The I/O device lies in one grid slot that is not occupied by any other I/O device and, if wider than a single grid slot, may also lie in additional whole and/or fractional grid slots. Accordingly, the grid slot location for the bump pad and one of the whole grid slot locations occupied by the I/O device are obtained. If the I/O device exclusively occupies only one grid slot, then the one grid slot location obtained for the I/O device in this step is that grid slot. On the other hand, if the I/O device exclusively occupies more than one grid slot, then preferably the obtained grid slot is selected in a predetermined manner (e.g., the rightmost grid slot exclusively occupied by the I/O device).

In step 262, a trace is routed between the grid slot location for the bump pad and a position corresponding to the grid slot location for the I/O device obtained in step 260. Preferably, the trace is implemented in the top metal layer (i.e., the layer containing the bump pads) and the path of the trace is obtained by using the two grid slot locations as references into a look-up table. The output of the look-up table preferably is a sequence of (x,y) coordinates which define the boundary of a trace.

In step 264, the pad location supplied in step 192 is obtained for the I/O device pad.

In step 266, the trace is extended, if necessary, to connect with a position corresponding to the device pad. In the preferred embodiment, if the pad is located entirely within the grid slot to which the trace was routed in step 262, no additional extension is required because in the preferred embodiment the trace occupies the entire grid slot. However, if the device pad is not located entirely within that grid slot, then in the preferred embodiment the trace is extended in the top layer so that the trace terminates at a point directly above the distant edge of the device pad. Specifically, if a portion of the device pad is located to the left of the initial grid slot, then the distant edge is the left edge of the pad. If a portion of the device pad is located to the right of the initial grid slot, then the distant edge is the right edge of the pad. In the preferred embodiment, the pad will not be wider than one grid slot. Preferably, the trace extension is specified by including one or more additional (x,y) coordinates, together with width information, in the trace description so as to extend the trace in the portion of the top layer corresponding to the I/O device's pad space.

In step 268, a via from the top layer to the semiconductor layer is specified at the position corresponding to the device pad, thereby completing the electrical connection.

Figure 9:
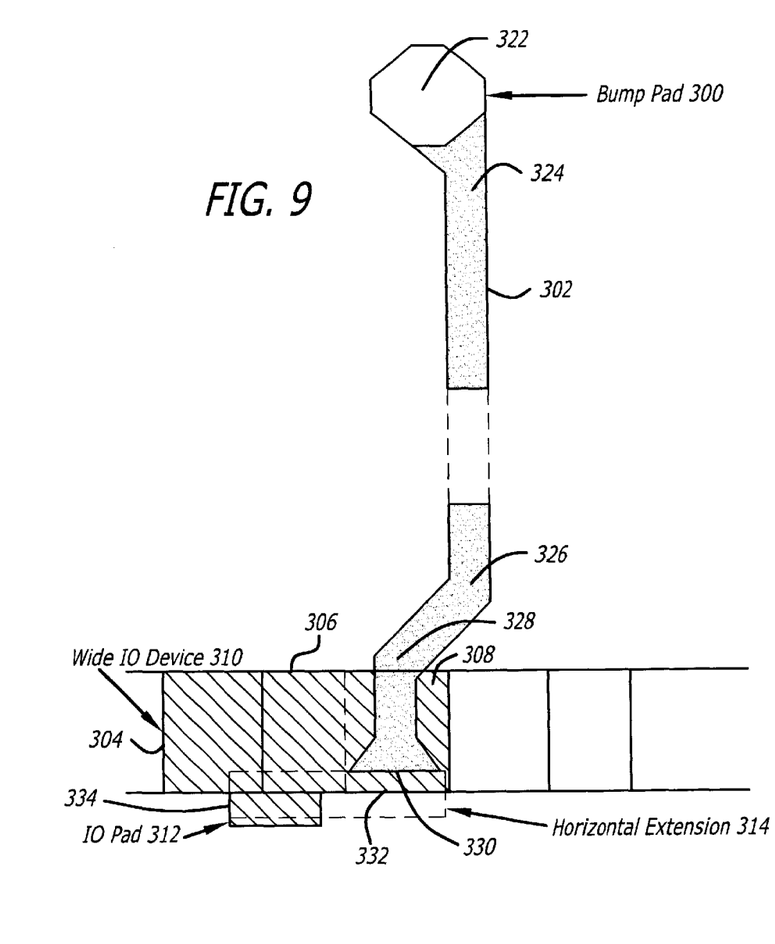
FIG. 9 illustrates a trace routing between a bump pad and an I/O device pad according to a representative embodiment of the invention.

An example of the foregoing process will now be described with reference to FIG. 9, which illustrates a trace routing between a bump pad 300 in the top metal layer of the die and a wide I/O device 310 in the bottom layer of the die. As shown in FIG. 9, I/O device 310 occupies three whole grid slots, i.e., grid slots 304, 306 and 308. A trace 302 initially is routed between bump pad 300 and grid slot 308 (the rightmost whole grid slot occupied by the I/O device) in the top layer of the die. Specifically, the grid slot indexes for bump pad 300 and I/O device 310 are used to look up a trace description in the library. In response, the library outputs a sequence of vertices 322, 324, 326, 328 and 330, which indicate the path of trace 302, together with width information for trace 302.

Next, based on the position of device pad 312 (which is located so that its center corresponds to the location of the I/O terminal within I/O device 310), horizontal extension 314 is then made to trace 302 in the top layer of the die, so as to extend trace 302 in the pad space of I/O device 310 to terminate at a position corresponding to (i.e., directly above) the left edge of device pad 312. Specifically, trace 302 is extended by adding vertices 332 and 334, as well as corresponding width information, to the trace description. Finally, a via is specified from the extended trace directly down to device pad 312 at a position corresponding to the location of the device pad, thus completing the connection from bump pad 300 to I/O device pad 312.

Fabrication

Upon completion of design, as described above, the integrated circuit can be fabricated using the masks generated in step 188, but otherwise employing conventional fabrication techniques. During fabrication, the masks generated in step 188 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Figure 10:
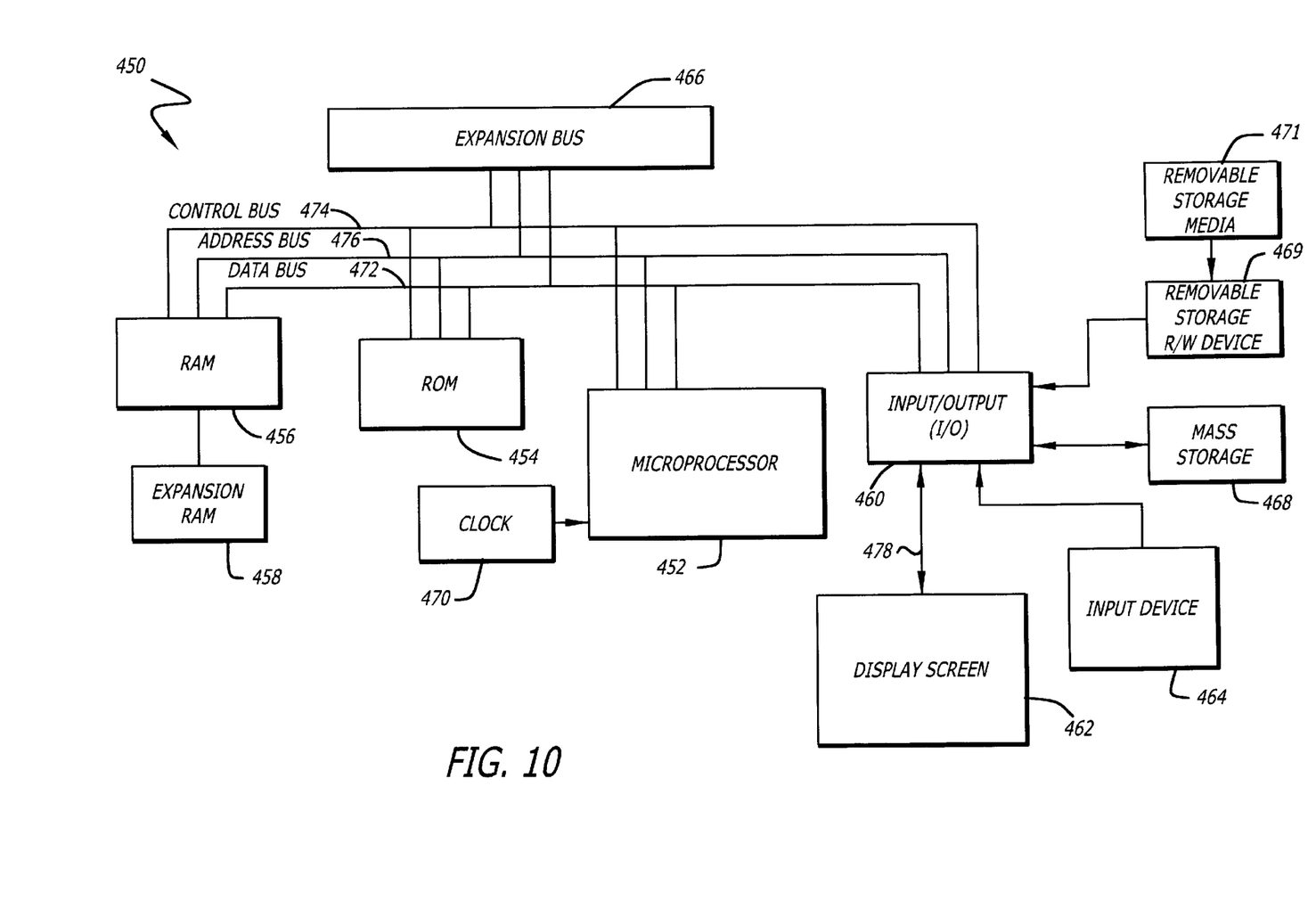
FIG. 10 is a block diagram of a general purpose computer system, representing one suitable computer platform for implementing the methods of the invention.

Generally, the methods described herein with respect to IC design will be practiced with a general purpose computer, either with a single processor or multiple processors. FIG. 10 is block diagram of a general purpose computer system, representing one of many suitable computer platforms for implementing the methods described above. FIG. 10 shows a general purpose computer system 450 in accordance with the present invention. As shown in FIG. 10, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

What is claimed is:

1. A method for tile-based routing between a bump pad and an input/output (I/O) device for implementation on a flip-chip integrated circuit (IC) die, the method comprising:
   a routing step of routing a trace between the bump pad and a position corresponding to a first I/O slot, the first I/O slot being at least partially occupied by the I/O device;
   an obtaining step of obtaining a position for a device pad for the I/O device; and
   an extension step of extending the trace into an area corresponding to the position obtained for the device pad,
   wherein said extension step extends the trace into a pad area for a second I/O slot, the second I/O slot being at least partially occupied by the I/O device.

2. A method according to claim 1, wherein the device pad is positioned so as to at least partially occupy a pad area for each of at least two I/O slots.

3. A method according to claim 1, wherein the I/O device is positioned near a periphery of the IC die.

4. A method according to claim 1, wherein the trace is formed on a top layer of the IC die, and wherein a direct electrical connection is formed from the top layer of the IC die to the device pad.

5. A method according to claim 1, wherein positions on the trace are directly above corresponding positions on the I/O device and the device pad.

6. A method for tile-based routing between a bump pad located on a top layer and an input/output (I/O) device located on a lower layer of a flip-chip integrated circuit (IC) die, comprising:
   a routing step of routing a trace between the bump pad and a position directly above a first I/O slot which is at least partially occupied by the I/O device;
   an obtaining step of obtaining a position for a device pad for the I/O device;
   an extension step of extending the trace into a pad area for a second I/O slot and to an area directly above the position obtained for the device pad, the second I/O slot being at least partially occupied by the I/O device; and
   a connecting step of providing a direct connection from the trace on the top layer of the IC die to the device pad on the lower layer.

7. An apparatus for tile-based routing between a bump pad and an input/output (I/O) device for implementation on a flip-chip integrated circuit (IC) die, said apparatus comprising:
   a processor for executing stored program instruction steps; and
   a memory connected to the processor for storing the program instruction steps,
   wherein the program instruction steps include: (1) a routing step to route a trace between the bump pad and a position corresponding to a first I/O slot, the first I/O slot being at least partially occupied by the I/O device; (2) an obtaining step to obtain a position for a device pad for the I/O device; and (3) an extension step to extend the trace into an area corresponding to the position obtained for the device pad, and
   wherein said extension step extends the trace into a pad area for a second I/O slot, the second I/O slot being at least partially occupied by the I/O device.

8. An apparatus according to claim 7, wherein positions on the trace are directly above corresponding positions on the I/O device and the device pad.

9. An apparatus for tile-based routing between a bump pad located on a top layer and an input/output (I/O) device located on a lower layer of a flip-chip integrated circuit (IC) die, comprising:
   a processor for executing stored program instruction steps; and
   a memory connected to the processor for storing the program instruction steps,
   wherein the program instruction steps include: (1) a routing step to route a trace between the bump pad and a position directly above a first I/O slot which is at least partially occupied by the I/O device; (2) an obtaining step to obtain a position for a device pad for the I/O device; (3) an extension step to extend the trace into a pad area for a second I/O slot and to an area directly above the position obtained for the device pad, the second I/O slot being at least partially occupied by the I/O device; and (4) a connecting step to provide a direct connection from the trace on the top layer of the IC die to the device pad on the lower layer.

10. Computer-executable process steps stored on a computer readable medium, said process steps for tile-based routing between a bump pad and an input/output (I/O) device for implementation on a flip-chip integrated circuit (IC) die, said process steps comprising:
    a routing step to route a trace between the bump pad and a position corresponding to a first I/O slot, the first I/O slot being at least partially occupied by the I/O device;
    an obtaining step to obtain a position for a device pad for the I/O device; and
    an extension step to extend the trace into an area corresponding to the position obtained for the device pad,
    wherein said extension step extends the trace into a pad area for a second I/O slot, the second I/O slot being at least partially occupied by the I/O device.

11. Computer-executable process steps according to claim 7, wherein positions on the trace are directly above corresponding positions on the I/O device and the device pad.

12. Computer-executable process steps stored on a computer readable medium, said process steps for tile-based routing between a bump pad located on a top layer and an input/output (I/O) device located on a lower layer of a flip-chip integrated circuit (IC) die, said process steps comprising:

a routing step to route a trace between the bump pad and a position directly above a first I/O slot which is at least partially occupied by the I/O device;

an obtaining step to obtain a position for a device pad for the I/O device;

an extension step to extend the trace into a pad area for a second I/O slot and to an area directly above the position obtained for the device pad, the second I/O slot being at least partially occupied by the I/O device; and a connecting step to provide a direct connection from the trace on the top layer of the IC die to the device pad on the lower layer.

13. A method according to claim 1, wherein said routing step is performed by using tile-based routing.

14. A method according to claim 6, wherein said routing step is performed by using tile-based routing.

* * * * *